United States Patent
Simonazzi et al.

(10) Patent No.: US 11,999,244 B2
(45) Date of Patent: Jun. 4, 2024

(54) ACTIVE DISCHARGE SYSTEM FOR ELECTRIC OR HYBRID MOTOR VEHICLES

(71) Applicant: META SYSTEM S.p.A., Reggio Emilia (IT)

(72) Inventors: Giuseppe Simonazzi, Reggio Emilia (IT); Cesare Lasagni, Reggio Emilia (IT); Severino Bigliardi, Reggio Emilia (IT)

(73) Assignee: META SYSTEM S.p.A., Reggio Emilia (IT)

( * ) Notice: Subject to any disclaimer, the term of this patent is extended or adjusted under 35 U.S.C. 154(b) by 693 days.

(21) Appl. No.: 17/265,407

(22) PCT Filed: Aug. 1, 2019

(86) PCT No.: PCT/IB2019/056556
§ 371 (c)(1),
(2) Date: Feb. 2, 2021

(87) PCT Pub. No.: WO2020/026180
PCT Pub. Date: Feb. 6, 2020

(65) Prior Publication Data
US 2021/0268910 A1 Sep. 2, 2021

(30) Foreign Application Priority Data

Aug. 3, 2018 (IT) ........................ 102018000007859

(51) Int. Cl.
*B60L 3/04* (2006.01)
*B60L 3/00* (2019.01)
(Continued)

(52) U.S. Cl.
CPC ............... *B60L 3/04* (2013.01); *B60L 3/0046* (2013.01); *H01L 27/0259* (2013.01); *H03H 19/004* (2013.01)

(58) Field of Classification Search
CPC ....................................................... B60L 3/04
(Continued)

(56) References Cited

U.S. PATENT DOCUMENTS

| 9,018,865 B2* | 4/2015 | Meyer, III ............ H01M 10/44 |
| | | 320/135 |
| 2013/0035819 A1* | 2/2013 | Wolft ................... B60L 3/0046 |
| | | 701/22 |

(Continued)

FOREIGN PATENT DOCUMENTS

CN        108 123 428 A     6/2018

*Primary Examiner* — Jerry D Robbins
(74) *Attorney, Agent, or Firm* — ASLAN LAW, P.C.

(57) ABSTRACT

An active discharge system for electric or hybrid motor vehicles including an active discharge circuit operatively connected in parallel to a charge circuit, which is supplied by a high voltage power source and defines an electrically-charged equivalent capacitance of an electric charge, wherein the active discharge circuit is configured to discharge the electric charge accumulated by the equivalent capacitance in the event of the high voltage power source being disconnected from the charge circuit; a control circuit/device/unit/component of the active discharge circuit which are configured to receive an activation signal, suitable to activating the active discharge circuit in case of receiving the activation signal, so as to discharge the equivalent capacitance.

19 Claims, 4 Drawing Sheets

(51) Int. Cl.
*H01L 27/02* (2006.01)
*H03H 19/00* (2006.01)

(58) Field of Classification Search
USPC .......................................................... 320/127
See application file for complete search history.

(56) References Cited

U.S. PATENT DOCUMENTS

| | | | |
|---|---|---|---|
| 2013/0200692 A1* | 8/2013 | Viancino | B60L 50/40 307/10.1 |
| 2013/0207458 A1* | 8/2013 | Viancino | B60L 3/0069 307/10.1 |
| 2013/0207619 A1* | 8/2013 | Viancino | H03K 17/163 320/166 |
| 2013/0234510 A1 | 9/2013 | Nakamura | |
| 2016/0226410 A1 | 8/2016 | Lopez De Arroyabe | |
| 2017/0355267 A1* | 12/2017 | Zhou | B60L 50/10 |

* cited by examiner

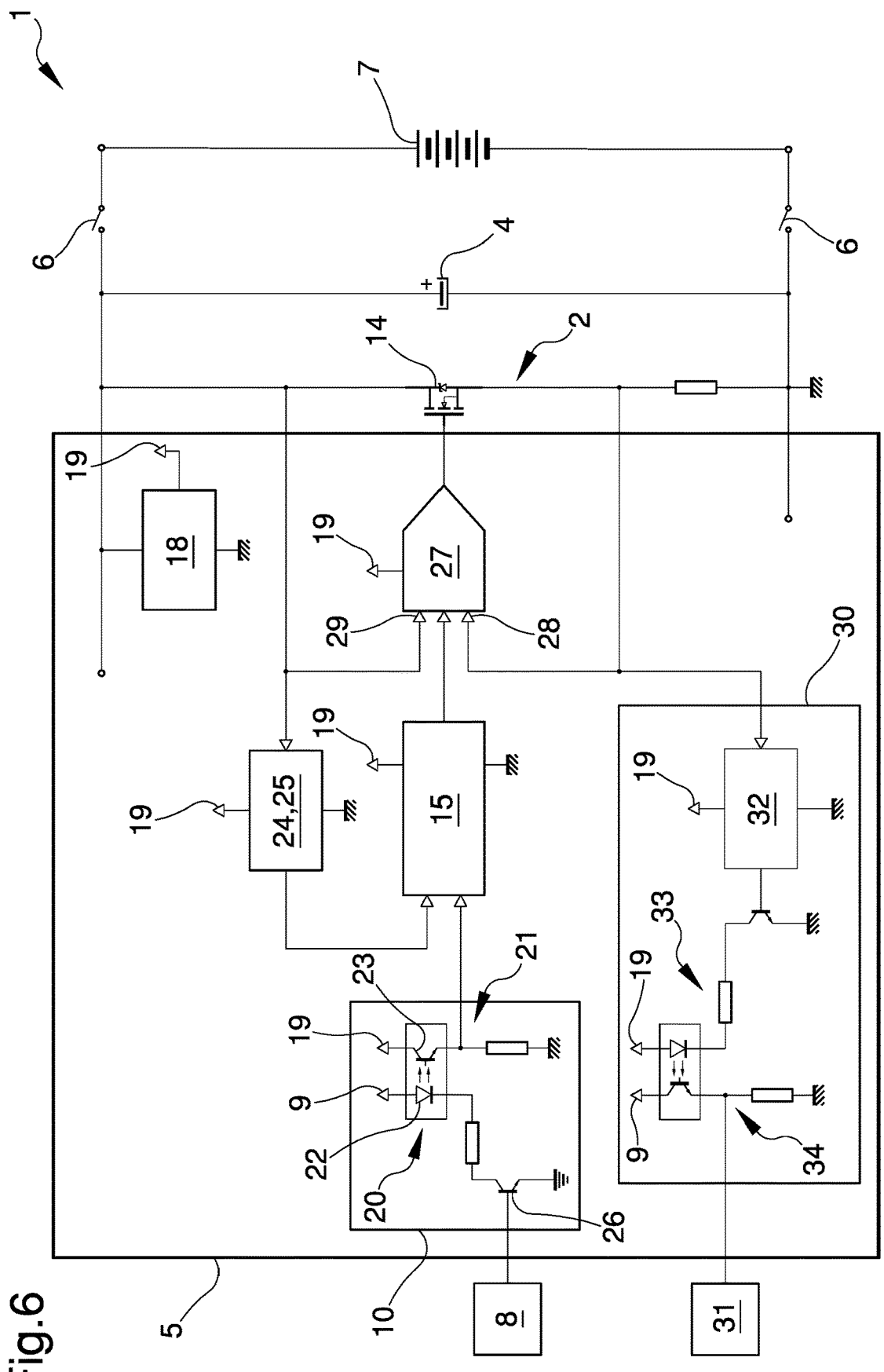

ACTIVE DISCHARGE SYSTEM FOR ELECTRIC OR HYBRID MOTOR VEHICLES

CROSS-REFERENCE TO RELATED APPLICATIONS

This application claims priority to IT Patent Application No. 102018000007859 filed on Aug. 3, 2018, and to PCT Application No. PCT/IB2019/056556 filed on Aug. 1, 2019, the entire contents of which are hereby incorporated by reference.

TECHNICAL FIELD

The present invention relates to an active discharge system for electric or hybrid motor vehicles.

BACKGROUND ART

There are several known active discharge systems for electric or hybrid motor vehicles which are generally used to discharge the electric charge accumulated in the electric system of the motor vehicle itself.

In particular, the electric system of the motor vehicle comprises a plurality of electronic appliances which, in the course of the following treatise, shall be indicated, by way of example, as charge circuits powered by a high voltage power source, which in the case taken into consideration is a high voltage battery.

More in detail, the charge circuits of this type comprise a plurality of electronic components of capacitive type having a total equivalent capacitance able to accumulate a far from negligible electric charge which for safety reasons must be discharged whenever the high voltage power source is disconnected from the electric system, e.g., following the switching off of the vehicle, a malfunction or a road accident.

In fact, although in these cases the high voltage power source is immediately isolated from the electric system of the motor vehicle, the equivalent capacitance remains electrically charged and, especially in the event of a malfunction or road accident, is very dangerous for the driver or passengers of the motor vehicle.

In this regard, some active discharge systems use a discharge resistor connected in parallel to the equivalent capacitance in order to discharge the accumulated charge thereof.

However, in order to implement an active discharge system with a discharge time comparable to the safety discharge times imposed by the relevant standard, it is necessary to use a discharge resistor with a particularly low resistance value, which would cause unacceptable power dissipation during normal vehicle operation.

To overcome this drawback, the use is known of switch means, such as, e.g., a transistor, connected in series to the discharge resistor.

This way, the switch means selectively connect/disconnect the discharge resistor to/from the charge circuits only if the equivalent capacitance has to be discharged.

In fact, in this case, the active discharge system comprises control means for controlling the switch means configured to activate/deactivate the discharge of the equivalent capacitance.

However, the active discharge systems of this type are susceptible to improvements linked to the coming into operation of the same active discharge system.

In particular, known active discharge systems are generally powered by a low voltage power source, in this case by a low voltage battery.

In fact, as mentioned above, the high voltage power source is immediately isolated from the vehicle's electric system, for example in the event of a road accident, and is not able to power the active discharge system.

Nevertheless, especially after a road accident, the low voltage power source could fail and consequently the active discharge system would not work because it is not powered.

Furthermore, the discharge time of the equivalent capacitance is strongly affected by the value of the discharge resistor and by the value of the electric charge to be discharged, which progressively decreases over time together with the discharge of the equivalent capacitance.

For this reason, the discharge transient of the equivalent capacitance through the discharge resistor is characterized by a particularly fast discharge time and by a particularly high power dissipation at the beginning of the transient, and on the contrary is characterized by a particularly slow discharge time and a particularly low power dissipation at the end of the transient.

This type of transient does not ensure the fastest discharge time and does not always permit discharging the total electric charge accumulated by the equivalent capacitance over a period of time less than or equal to the safety discharge time.

The drawbacks just described seriously endanger the safety of the driver or the passengers of the motor vehicle.

DESCRIPTION OF THE INVENTION

The main aim of the present invention is to provide an active discharge system for electric or hybrid motor vehicles which also permits discharging the equivalent capacitance in the absence of external power sources.

A further object of the present invention is to provide an active discharge system for electric or hybrid motor vehicles which makes it possible to modulate the discharge transient of the electric charge accumulated by the equivalent capacitance and which ensures a discharge time less than or equal to the safety discharge time.

An additional object of the present invention is to provide an active discharge system which allows the activation of the active discharge circuit even if the low voltage power source is not available.

A further object of the present invention is to provide an active discharge system for electric or hybrid motor vehicles which allows overcoming the aforementioned drawbacks of the prior art in a simple, rational, easy, effective to use and low cost solution.

The objects set forth above are achieved by the present active discharge system for electric or hybrid motor vehicles having the characteristics of claim 1.

BRIEF DESCRIPTION OF THE DRAWINGS

Other characteristics and advantages of the present invention will become more evident from the description of several preferred but not exclusive embodiments of an active discharge system for electric or hybrid motor vehicles, illustrated by way of a non-limitative example in the accompanying tables of drawings in which:

FIG. 6 is a detailed schematic view of the embodiment shown in FIG. 4.

EMBODIMENTS OF THE INVENTION

Figure 1:
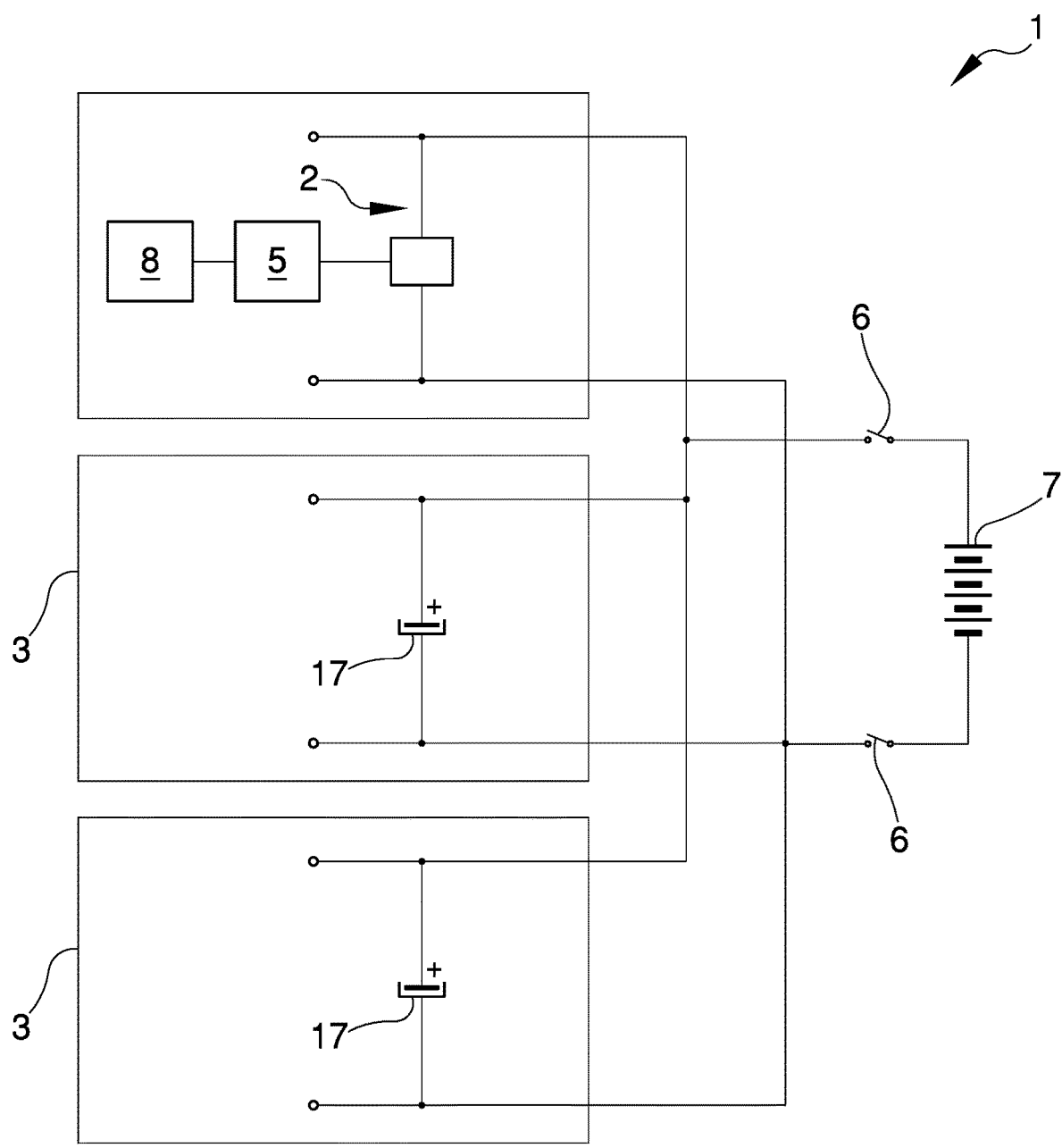
FIG. 1 is a schematic view of the system 1 according to the invention.
Figure 2:
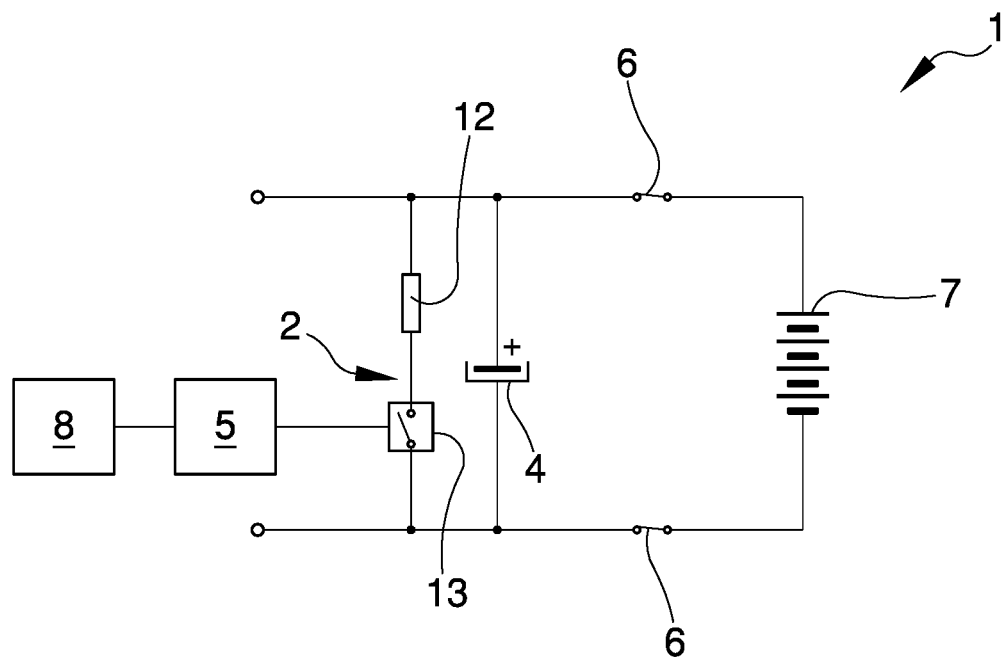
FIG. 2 is a schematic view of an embodiment of the system according to the invention in which the active discharge circuit is deactivated.
Figure 3:
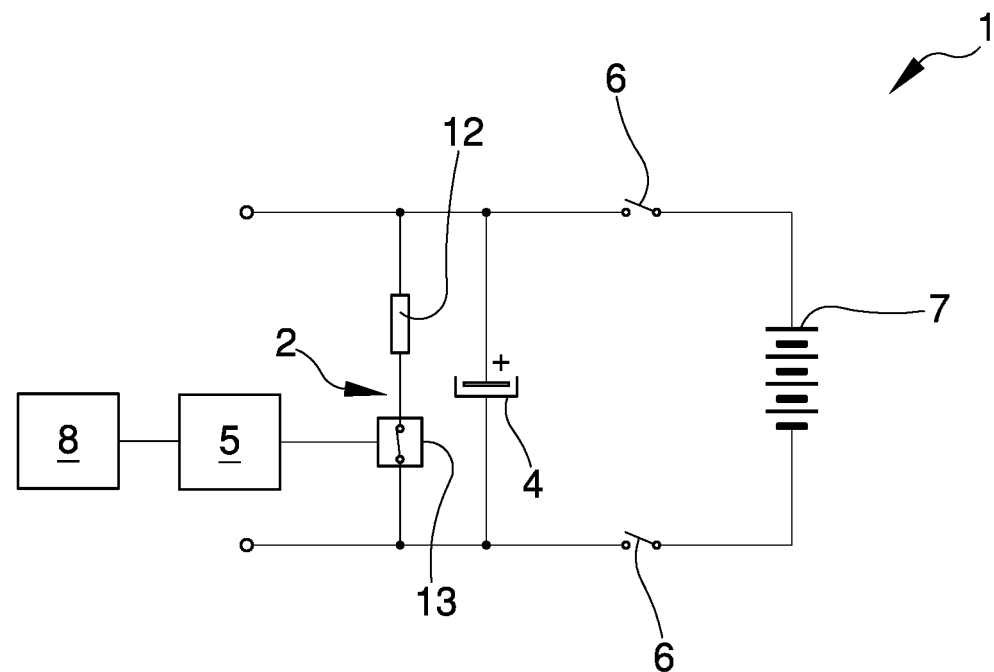
FIG. 3 is a schematic view of the embodiment shown in FIG. 2 in which the active discharge circuit is activated.

With particular reference to these figures, reference numeral 1 globally indicates an active discharge system for electric or hybrid motor vehicles.

The active discharge system 1 for electric or hybrid motor vehicles comprises:
- at least one active discharge circuit 2 operatively connected in parallel to at least one charge circuit 3, which is supplied by at least one high voltage power source 7 and defines at least one electrically-charged equivalent capacitance 4 of an electric charge, the active discharge circuit 2 being configured to discharge the electric charge of the equivalent capacitance 4 in the event of the high voltage power source 7 being disconnected from the at least one charge circuit 3;
- control means 5 of the active discharge circuit 2 which are configured to receive at least one activation signal, the control means 5 activating the active discharge circuit 2 the instant when they receive the activation signal, so as to discharge the equivalent capacitance 4.

Appropriately, in the rest of the following treatise the term "charge circuit" means a circuit which absorbs power from a power supply, in this case taken into account by the high voltage power source 7.

In particular, the high voltage power source 7 is preferably a high voltage electric battery which is electrically connected in parallel to a plurality of charge circuits 3 of the motor vehicle, which in this way are powered by the battery itself.

More in detail, the charge circuits 3 comprise a plurality of electronic devices, comprising a wide variety of capacitive components 17, which, during normal operation of the corresponding charge circuits 3, accumulate an electric charge.

As a result, the high voltage power source 7 sees at output the equivalent capacitance 4 defined by the overall effect of all the electronic capacitive components 17 of each of the charge circuits 3, as shown in FIGS. 2-5.

In fact, with particular reference to the illustrations, the charge circuits 3 are represented by way of example as a logic block comprising a capacitive component 17.

In particular, the equivalent capacitance 4 defined in this way must be discharged from the active discharge circuit 2 the moment the control means 5 receive the activation signal.

In fact, the high voltage power source 7 is preferably of the disconnectable type, i.e. interruption means 6 are provided of the power supply supplied by the high voltage power source 7, configured to disconnect the latter electrically from the charge circuits 3 and from the active discharge circuit 2, for example in the event of a road accident.

This way, the active discharge circuit 2 can discharge the electric charge accumulated by the equivalent capacitance 4.

In fact, if the high voltage power source 7 were not electrically disconnected from the charge circuits 3 and from the active discharge circuit 2, the latter would not be able to discharge the equivalent capacitance 4, which would be continuously charged by the high voltage power source 7.

This would cause an unacceptable power consumption during normal operation of the motor vehicle.

For this reason, the control means 5 activate the active discharge circuit 2 after the disconnection of the high voltage power source 7.

In addition, the control means 5 are connected to the equivalent capacitance 4. This way, the control means 5 are powered by the electric charge accumulated by the equivalent capacitance 4.

The control means 5, in fact, comprise conversion means 18 of the electric charge accumulated by the equivalent capacitance 4 in a power voltage 19 of the control means 5.

This way, if the equivalent capacitance 4 is discharged, the control means 5 are not powered and the active discharge circuit 2 does not discharge the electric charge. However, since there is no electric charge to be discharged, this operating condition does not require the activation of the active discharge circuit 2.

On the other hand, if the equivalent capacitance 4 is charged, the control means 5 are powered by the electric charge accumulated by the equivalent capacitance 4, which is consequently discharged by the active discharge circuit 2.

In particular, this technical solution has the advantage of making the operation of the active discharge system 1 independent of the power supply.

In fact, the conversion means 18 substantially power every component and device comprised by the control means 5.

Advantageously, the active discharge circuit 2 comprises dissipation means 12, 13, 14 of the electric charge accumulated by the equivalent capacitance 4, the dissipation means 12, 13, 14 being adapted to discharge the electric charge through a discharge current.

In particular, the dissipation means 12, 13, 14 comprise resistive means 12 adapted to conduct the discharge current and to discharge the electric charge accumulated by the equivalent capacitance 4.

Preferably, the resistive means 12 comprise one or more resistive elements, composed of e.g. electric resistances.

Furthermore, the dissipation means 12, 13, 14 comprise switch means 13 operatively connected to the control means 5.

In particular, the control means 5 activate the switch means 13 to allow the passage of the discharge current and to discharge the electric charge accumulated by the equivalent capacitance 4.

Moreover, as previously mentioned, the control means 5 activate the switch means 13 the instant when they receive the activation signal.

In fact, the control means 5 are operatively connected to the signaling means 8 configured to send the activation signal and powered by at least one low voltage power source 9.

Moreover, the control means 5 comprise monitoring means 10 of the low voltage power source 9 and are configured to activate the active discharge circuit 2 in case they do not detect the low voltage power source 9.

Preferably, the monitoring means 10 comprise at least one receiving branch 20 for receiving the activation signal operatively connected to the signaling means 8 and to the low voltage power source 9, and at least one monitoring branch 21 of the low voltage power source 9 operatively coupled to the receiving branch 20 by means of first optical coupling means 22, 23, e.g., an optocoupler, which keep the receiving branch 20 and the monitoring branch 21 optically coupled, but galvanically decoupled.

Preferably, the receiving branch 20 comprises at least one selector element 26 configured to change its status as a result of the reception of the activation signal and consequently to couple the receiving branch 20 to the monitoring branch 21 by means of the first optical coupling means 22, 23.

In fact, as shown in FIG. 6, the first optical coupling means 22, 23 preferably comprise a light source 22, for example a LED, electrically connected to the receiving branch 20 and configured to be activated by the selector element 26, and a photosensitive element 23, e.g., such as a phototransistor, optically coupled to the light source 22 and electrically connected to the monitoring branch 21.

In particular, the light source 22 is connected to the low voltage power source 9 and is connected in series to a resistive element and to the selector element 26, which is in turn connected to the ground.

This way, in the absence of the activation signal, the light source 22 is activated by the selector element 26 and is coupled to the photosensitive element 23, which does not activate the discharge of the active discharge circuit 2.

On the contrary, in the presence of the activation signal generated by the signaling means 8, the light source 22 is deactivated by the selector element 26 and is decoupled by the photosensitive element 23, which activates the active discharge circuit 2.

Similarly, if the power supply from the low voltage power source 9 fails, the light source 22 is deactivated and the photosensitive element 23 activates the active discharge circuit 2 regardless of whether or not there is an activation signal.

This way, if the signaling means 8 do not work, e.g., due to a malfunction of the low voltage power source 9, the control means 5 detect such malfunction through the monitoring means 10 and allow the activation of the active discharge circuit 2, which discharges the electric charge accumulated by the equivalent capacitance 4 in a finite time.

Appropriately, the control means 5 comprise timing means 15 of the discharge time of the equivalent capacitance 4 configured to deactivate the active discharge circuit 2 after a predefined discharge time 16.

In particular, the timing means 15 are connected to the monitoring means 10 and are configured to calculate the predefined discharge time 16 starting from the instant when the active discharge circuit 2 is activated.

In fact, the instant when the signaling means 8 send the activation signal or the monitoring means 10 detect the power supply failure of the low voltage power source 9, the timing means 15 are configured so as to keep the active discharge circuit 2 active for a time equal to the predefined discharge time 16.

In particular, the timing means 15 comprise verification means 24 for verifying the electric charge accumulated by the equivalent capacitance 4, the timing means 15 being configured to deactivate the active discharge circuit 2 in case the value of the electric charge verified by the verification means 24 is not substantially decreasing in value over time.

Preferably, the verification means 24 are of the type of a voltage drop detector which is connected to the equivalent capacitance 4.

Such solution prevents the active discharge circuit 2 from being active while the high voltage power source 7 is electrically connected to the charge circuits 3.

In fact, as a result of an incorrect activation of the active discharge circuit 2, caused e.g. by a false activation signal or by a temporary malfunction of the low voltage power source 9, the equivalent capacitance 4 is charged by the high voltage power source 7 and at the same time is discharged by the active discharge circuit 2.

When this occurs, the electric charge value accumulated by the equivalent capacitance 4 remains substantially constant and does not decrease over time despite part of the electric charge being discharged by the active discharge circuit 2.

This causes continuous power dissipation and jeopardizes the correct operation of the motor vehicle.

Furthermore, the control means 5 comprise extension means 25 of the predefined discharge time 16 which are configured to extend the latter by a predefined extension time in the event of the electric charge value verified by the verification means 24 being greater than a predefined threshold value at the end of the predefined discharge time 16.

In other words, if at the end of the predefined discharge time 16 the electric charge accumulated by the equivalent capacitance 4 is decreasing over time, but is not lower than the predefined threshold value, which in this case coincides with a safety value of about 60V, the control means 5 keep the active discharge circuit 2 active for an extension time, which in this case coincides with an extra time of about two seconds, so as to allow further discharging the equivalent capacitance 4.

However, at the end of the extension time, the control means 5 deactivate the switch means 13 and consequently also deactivate the active discharge circuit 2. In particular, in a first embodiment of the system 1 shown in FIG. 2, the switch means 13 are connected in series to the resistive means 12.

This way, when the control means 5 activate the switch means 13, the latter allow the resistive means 12 to discharge the electric charge accumulated by the equivalent capacitance 4.

In fact, in this embodiment, the switch means 13 comprise one or more switch elements configured to open and close the active discharge circuit 2.

In other words, the switch means 13 are substantially configured as pure on/off switches which activate the discharge of the equivalent capacitance 4 for the predefined discharge time 16 in the event of the control means 5 receiving the activation signal or detecting a failure in the power supply provided by the low voltage power source 9.

Figure 4:
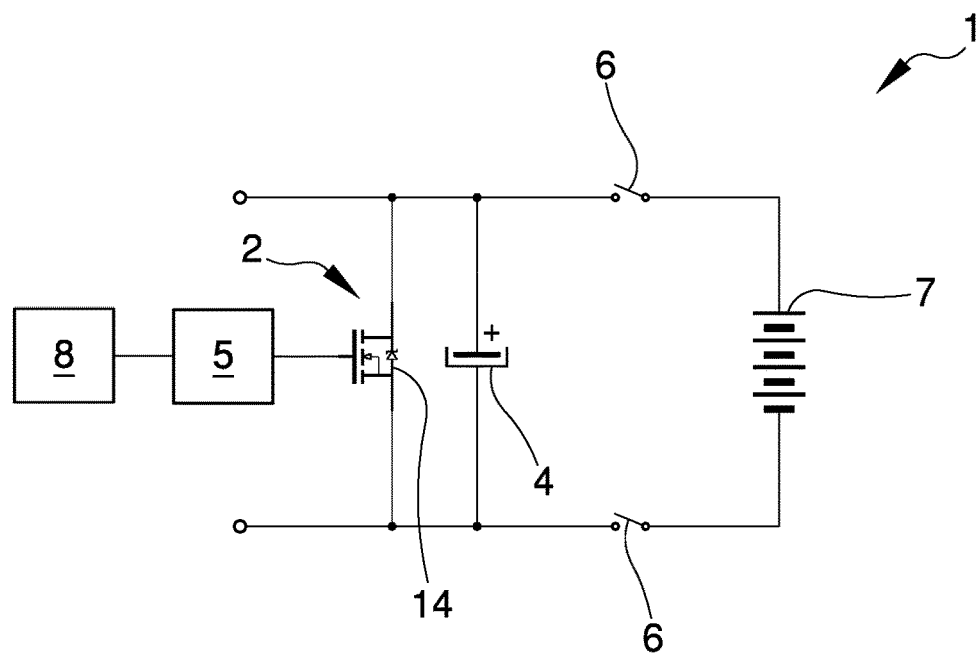
FIG. 4 is a schematic view of a further embodiment of the system according to the invention.

One alternative embodiment of the system 1 is shown in FIG. 4, wherein the switch means 13 and the resistive means 12 coincide.

In particular, the switch means 13 and the resistive means 12 are made through at least one transistor 14 operatively connected to the control means 5.

More in detail, such at least one transistor 14 can be composed of an insulated gate bipolar transistor (IGBT).

Preferably, in this embodiment the dissipation means 12, 13, 14 comprise a plurality of transistors 14 appropriately connected to each other.

In fact, in this embodiment, the transistor 14 does not behave like a simple on/off switch, but once turned on it behaves like a resistance of variable value able to discharge the electric charge accumulated by the equivalent capacitance 4.

Conveniently, the control means 5 comprise biasing means 27 of the transistor 14 which are configured to vary the value of the discharge current of the electric charge accumulated by the equivalent capacitance 4 flowing through the transistor 14.

In fact, as mentioned above, the transistor 14 is sized to behave like a resistance of variable value depending on the voltage value at which it is biased by the biasing means 27.

Consequently, the discharge current flowing through the transistor 14 depends on the voltage value at which the biasing means 27 polarize the transistor itself.

Conveniently, the biasing means 27 comprise at least one of detection means 28 for detecting the value of the discharge current and measurement means 29 for measuring the value of the electric charge to be discharged.

In particular, the biasing means 27 are configured to vary the value of the discharge current depending on at least one of the value of the discharge current detected by the detection means 28 and the value of the electric charge measured by the measurement means 29.

Preferably, in the embodiment shown in FIG. 6, the biasing means 27 comprise both the detection means 28 and the measurement means 29.

This way, the biasing means 27 periodically monitor the value of the discharge current and the value of the electric charge to be discharged in order to optimize the discharge transient of the electric charge accumulated by the equivalent capacitance 4 as described below.

At the beginning of the discharge transient of the equivalent capacitance 4, when the electric charge to be discharged is particularly high, the biasing means 27 maintain the resistance value of the transistor 14 substantially high so as not to cause a discharge of the electric charge which is too fast and out of control, as this could damage the charge circuits 3 or the same active discharge circuit 2. On the contrary, at the end of the discharge transient of the equivalent capacitance 4, when the electric charge to be discharged is particularly low, the biasing means 27 maintain the resistance value of the transistor 14 substantially reduced in order to quickly discharge the electric charge which is still accumulated by the equivalent capacitance 4 and which otherwise would require a particularly high discharge time, i.e. greater than the safety discharge time.

It is important to notice that the terms "high" and "reduced" used with reference to the resistance value of the transistor 14 and to the value of the electric charge accumulated by the equivalent capacitance 4, are to be considered as purely approximate values which vary from one to another depending on the circuit characteristics of the active discharge circuit 2 and of the charge circuit 3.

However, such values are univocally defined during each moment of the discharge transient by one or more predefined equations, such as, e.g., the discharge equations of a capacitor of an RC network, in order to achieve the discharge of the electric charge accumulated by the equivalent capacitance 4 in a predefined time.

Conveniently, the biasing means 27 are configured to maintain the transistor 14 driven in linear operating region throughout the discharge transient of the equivalent capacitance 4.

This solution permits varying the resistance of the transistor 14 and the discharge current in a particularly precise way and consequently discharging the equivalent capacitance 4 in a continuous and controlled way, making it possible to respect the safety discharge time, which generally lasts five seconds, and dissipating a power of substantially constant value during the entire discharge transient.

Figure 5:
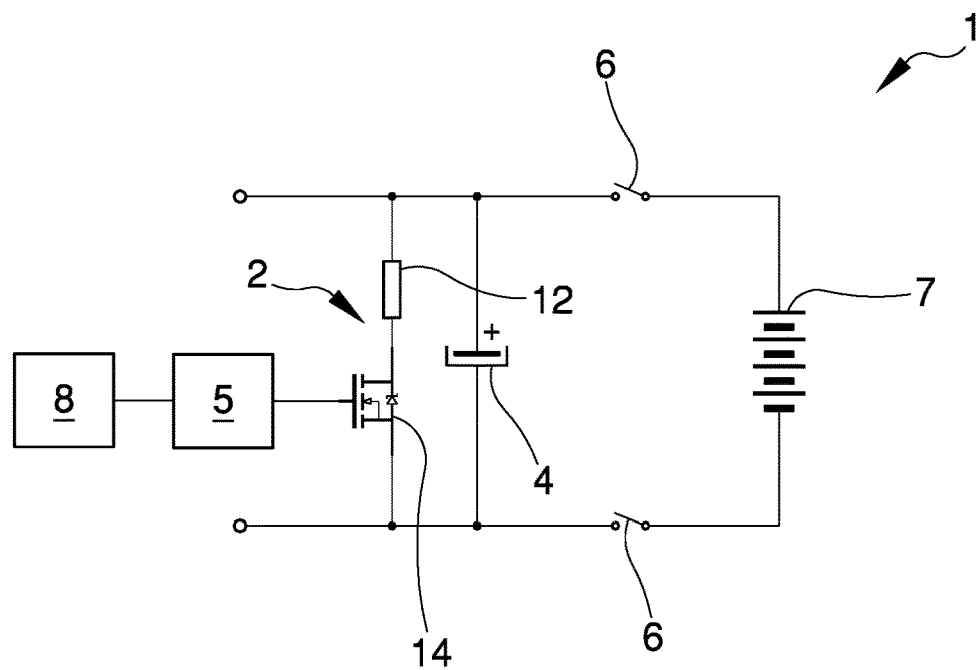
FIG. 5 is a schematic view of another embodiment of the system according to the invention.

Alternative embodiments of the system 1 cannot however be ruled out wherein the dissipation means 12, 13, 14 comprise resistive means 12 electrically connected in series to at least one transistor 14 as defined in the previously-described embodiment and as shown in FIG. 5.

Appropriately, the biasing means 27 are configured to activate the transistor 14 for the time necessary to discharge the electric charge accumulated by the equivalent capacitance 4.

For this reason, the biasing means 27 are operatively connected to the timing means 15, which are intended to temporize the activation time of the biasing means 27 of the active discharge circuit 2 as previously described.

In other words, the timing means 15 allow the biasing means 27 to activate the active discharge circuit 2 for the predefined discharge time 16 and if necessary for the extension time.

Advantageously, the control means 5 comprise diagnostic means 30 of the active discharge circuit 2 configured to signal the activation of the latter to at least one diagnostic unit 31.

In particular, the diagnostic means 30 comprise:
warning means 33, 34 for warning about the activation of the active discharge circuit 2 which are configured to send at least one warning signal to the diagnostic unit 31;
checking means 32 for checking the activation of the active discharge circuit 2 which are configured to check the presence of the discharge current and to activate the warning means 33, 34 the instant when they check the presence of the discharge current.

Preferably, the checking means 32 are a current detector operatively connected to the warning means 33, 34.

The warning means 33, 34, on the other hand, are structurally similar to the monitoring means 10.

More in detail, the warning means 33, 34 comprise at least one warning branch 33 operatively connected to the checking means 32 and at least one diagnostic branch 34 operatively connected to the diagnostic unit 31.

In addition, similarly to what has been described with reference to the monitoring means 10, the warning means 33, 34 comprise second optical coupling means 35 of the warning branch 33 to the diagnostic branch 34.

In particular, the warning branch 33 and the diagnostic branch 34 are structurally similar to the receiving branch 20 and to the monitoring branch 21, and the second optical coupling means 35 are structurally similar to the first optical coupling means 22, 23, respectively as shown in FIG. 6.

In fact, when the discharge current is present, the checking means 32 activate the warning branch 33, which establishes the coupling with the diagnostic branch 34 which in turn signals to the diagnostic unit 31 the activation of the active discharge circuit 2.

The diagnostic unit 31 is preferably a device configured to display a plurality of warnings, including the activation warning of the active discharge circuit 2.

Furthermore, the diagnostic unit 31 is preferably available for reference by a skilled operator, who in this way can check the correct operation of the system 1.

The system 1 just described is preferably used to discharge the equivalent capacitance 4 of the devices and/or of the components used in the battery chargers for electric or hybrid motor vehicles.

In particular, the present invention relates to a battery charger comprising at least one active discharge system as previously described.

The charger is preferably of the type of an OBC (On Board Charger).

It has in practice been found that the described invention achieves the intended objects.

In particular, the fact is underlined that the use of one or more transistors which permit varying the discharge resistor value of the active discharge circuit significantly improves the discharge transient of the electric charge accumulated by the equivalent capacitance, decreasing the discharge time and increasing the efficiency thereof.

Furthermore, the power supply to the control means by means of the electric charge accumulated by the equivalent capacitance to be discharged permits the active discharge circuit to be activated whenever there is a charge to be discharged, regardless of whether the vehicle power supply is available or not.

Moreover, the use of monitoring means to verify at any time the presence of the power supplied by the low voltage power source permits activating the active discharge circuit independently from the operation of the signaling means.

In summary, the technical solutions listed above make the active discharge system independent of factors which are generally critical for the operation thereof, significantly increasing the safety of the driver of the motor vehicle and of any passengers.

The invention claimed is:

1. An active discharge system for electric or hybrid motor vehicles, the active discharge system comprising:
    at least one active discharge circuit operatively connected in parallel to at least one charge circuit, which is supplied by at least one high voltage power source and defines at least one electrically-charged equivalent capacitance of an electric charge, said active discharge circuit being configured to discharge the electric charge accumulated by said equivalent capacitance in the event of said high voltage power source being disconnected from said at least one charge circuit; and
    control means of said active discharge circuit which are configured to receive at least one activation signal, said control means activating said active discharge circuit in case of receiving said activation signal, so as to discharge said equivalent capacitance, wherein
    said control means comprise diagnostic means of said active discharge circuit configured to signal the activation of the latter to at least one diagnostic unit.

2. The system according to claim 1, wherein
    said control means are connected to said equivalent capacitance, and
    said control means being supplied by the electric charge accumulated by said equivalent capacitance.

3. The system according to claim 2, wherein
    said control means comprise conversion means of the electric charge accumulated by said equivalent capacitance in a power voltage of said control means.

4. The system according to claim 1, wherein
    said control means are operatively connected to signaling means configured to send said activation signal and supplied by at least one low voltage power source, and
    said control means comprise monitoring means of said low voltage power source and being configured to activate said active discharge circuit in case said low voltage power source is not detected.

5. The system according to claim 1, wherein
    said control means comprise timing means of the discharge time of said equivalent capacitance configured to deactivate said active discharge circuit after a predefined discharge time.

6. The system according to claim 5, wherein
    said control means comprise extension means of said predefined discharge time configured to extend the latter by a predefined extension time in the event of said electric charge value verified by said verification means is greater than a predefined threshold value at the end of said predefined discharge time.

7. The system according to claim 5, wherein
    said timing means comprise verification means for verifying the electric charge accumulated by said equivalent capacitance, and
    said timing means being configured to deactivate said active discharge circuit in case the value of said electric charge verified by said verification means is not substantially decreasing in value over time.

8. The system according to claim 1, wherein
    said active discharge circuit comprises dissipation means of the electric charge accumulated by said equivalent capacitance, and
    said dissipation means being able to discharge said electric charge through a discharge current.

9. The system according to claim 8, wherein
    said dissipation means comprise resistive means which are adapted to conduct said discharge current and to discharge the electric charge accumulated by said equivalent capacitance.

10. The system according to claim 9, wherein
    said dissipation means comprise switch means operatively connected to said control means, and
    said control means activating said switch means to allow the passage of said discharge current and to discharge the electric charge accumulated by said equivalent capacitance.

11. The system according to claim 10, wherein
    said switch means are connected in series to said resistive means.

12. The system according to claim 10, wherein
    said switch means and said resistive means coincide, said switch means and said resistive means being made through at least one transistor operatively connected to said control means.

13. The system according to claim 12, wherein
    said at least one transistor is of the type of an insulated gate bipolar transistor (IGBT).

14. A battery charger, the battery charger comprising:
    said at least one active discharge system according to claim 1.

15. The system according to claim 1, wherein
    said diagnostic means comprise:
    warning means for warning about the activation of said active discharge circuit which are configured to send at least one warning signal to said diagnostic unit; and
    checking means for checking the activation of said active discharge circuit which are configured to check the presence of said discharge current and to activate said warning means the instant when the presence of said discharge current is checked.

16. An active discharge system for electric or hybrid motor vehicles, the active discharge system comprising:
    at least one active discharge circuit operatively connected in parallel to at least one charge circuit, which is supplied by at least one high voltage power source and defines at least one electrically-charged equivalent capacitance of an electric charge, said active discharge circuit being configured to discharge the electric charge accumulated by said equivalent capacitance in the event of said high voltage power source being disconnected from said at least one charge circuit; and control means of said active discharge circuit which are configured to receive at least one activation signal, said control means activating said active discharge circuit in case of receiving said activation signal, so as to discharge said equivalent capacitance, wherein said active discharge circuit comprises dissipation means of the electric charge accumulated by said equivalent capacitance, and said dissipation means being able to discharge said electric charge through a discharge current, said dissipation means comprise resistive means which are adapted to conduct said discharge current and to discharge the electric charge accumulated by said equivalent capacitance, said dissipation means comprise switch means operatively connected to said control means, and said control means activating said switch means to allow the passage of said discharge current and to discharge the electric charge accumulated by said equivalent capacitance, said switch means and said resistive means coincide, said switch means and said resistive means being made through at least one transistor operatively connected to said control means, and said control means comprise biasing means of said at least one transistor configured to vary the value of said discharge current of the electric charge accumulated by the equivalent capacitance passing through said at least one transistor depending on the value of the electric charge accumulated by said equivalent capacitance to be discharged and on the value of the electric charge discharged through said at least one transistor.

17. The system according to claim 16, wherein said biasing means comprise at least one of detection means for detecting the value of said discharge current and measurement means for measuring the value of said electric charge to be discharged, and said biasing means being configured to vary the value of said discharge current depending on at least one of the value of said discharge current detected by said detection means and the value of said electric charge measured by said measurement means.

18. The system according to claim 16, wherein said control means comprise diagnostic means of said active discharge circuit configured to signal the activation of the latter to at least one diagnostic unit.

19. The system according to claim 18, wherein said diagnostic means comprise:

warning means for warning about the activation of said active discharge circuit which are configured to send at least one warning signal to said diagnostic unit; and checking means for checking the activation of said active discharge circuit which are configured to check the presence of said discharge current and to activate said warning means the instant when said checking means checks the presence of said discharge current.

* * * * *